United States Patent
Myers et al.

(10) Patent No.: US 10,943,529 B2
(45) Date of Patent: Mar. 9, 2021

(54) ELECTRONIC DEVICES WITH FLEXIBLE DISPLAYS

(71) Applicant: Apple Inc., Cupertino, CA (US)

(72) Inventors: Scott A. Myers, Saratoga, CA (US); Richard H. Koch, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 282 days.

(21) Appl. No.: 15/840,725

(22) Filed: Dec. 13, 2017

(65) Prior Publication Data
US 2019/0069451 A1    Feb. 28, 2019

Related U.S. Application Data

(60) Provisional application No. 62/551,170, filed on Aug. 28, 2017.

(51) Int. Cl.
*G09G 3/3208* (2016.01)
*H05K 7/20* (2006.01)
(Continued)

(52) U.S. Cl.
CPC ......... *G09G 3/3208* (2013.01); *F24C 15/022* (2013.01); *G02F 1/133305* (2013.01); *G02F 1/133382* (2013.01); *G06F 1/1618* (2013.01); *G06F 1/1652* (2013.01); *G06F 1/1679* (2013.01); *G09G 5/10* (2013.01); *G09G 5/14* (2013.01); *H01L 27/3225* (2013.01); *H01L 51/524* (2013.01); *H01L 51/529* (2013.01); *H01L 51/5237* (2013.01); *H05K 5/0017* (2013.01); *H05K 5/0221* (2013.01); *H05K 7/20954* (2013.01); *H05K 7/20963* (2013.01); *E05B 65/0067* (2013.01); *G06F 1/1681* (2013.01); *G06F 1/1694* (2013.01); *G09G 2320/041* (2013.01); *G09G 2320/0626* (2013.01); *G09G 2330/04* (2013.01);
(Continued)

(58) Field of Classification Search
CPC ......... G06F 1/1651; G06F 1/1616–162; G06F 1/1679; G06F 1/16–1698; G09G 2380/02; H01L 51/529; B29C 73/34; F24C 15/022
See application file for complete search history.

(56) References Cited

U.S. PATENT DOCUMENTS

| 9,560,751 | B2 | 1/2017 | Huitema et al. |
| 2006/0152454 | A1* | 7/2006 | Cok ..................... G09G 3/3208 345/82 |

(Continued)

*Primary Examiner* — Sanjiv D. Patel
(74) *Attorney, Agent, or Firm* — Treyz Law Group, P.C.; G. Victor Treyz; David K. Cole

(57) ABSTRACT

An electronic device may have a hinge that allows the device to be flexed about a bend axis. A display may span the bend axis. To facilitate bending about the bend axis without damage when the display is cold, a portion of the display that overlaps the bend axis may be selectively heated. The portion of the display that overlaps the bend axis may be self-heated by illuminating pixels in the portion of the display that overlap the bend axis or may be heated using a heating element or other heating structure that provides heat to the portion of the display overlapping the bend axis. Control circuitry may engage a latching mechanism that prevents opening and closing of the electronic device when the temperature of the portion of the display that overlaps the bend axis is below a predetermined temperature.

18 Claims, 10 Drawing Sheets

(51) Int. Cl.
  *H05K 5/00* (2006.01)
  *H05K 5/02* (2006.01)
  *H01L 51/52* (2006.01)
  *H01L 27/32* (2006.01)
  *G06F 1/16* (2006.01)
  *G09G 5/10* (2006.01)
  *G09G 5/14* (2006.01)
  *G02F 1/1333* (2006.01)
  *F24C 15/02* (2006.01)
  *E05B 65/00* (2006.01)

(52) U.S. Cl.
  CPC ..... *G09G 2354/00* (2013.01); *G09G 2380/02* (2013.01); *H01L 2251/5338* (2013.01)

(56) References Cited

U.S. PATENT DOCUMENTS

| | | | |
|---|---|---|---|
| 2007/0200497 A1* | 8/2007 | Matsudate | H01L 51/5237 313/512 |
| 2009/0144934 A1* | 6/2009 | Kitagawa | G06F 1/1616 16/320 |
| 2013/0076658 A1* | 3/2013 | Cassar | G06F 3/1438 345/173 |
| 2013/0081756 A1* | 4/2013 | Franklin | B29C 53/04 156/221 |
| 2014/0232956 A1 | 8/2014 | Kwon et al. | |
| 2016/0066409 A1 | 3/2016 | Kwon et al. | |
| 2016/0093685 A1 | 3/2016 | Kwon et al. | |
| 2016/0116944 A1 | 4/2016 | Lee et al. | |
| 2016/0351107 A1 | 12/2016 | Chen et al. | |
| 2017/0064879 A1* | 3/2017 | Lee | G06F 1/16 |
| 2018/0081399 A1* | 3/2018 | Kwon | G06F 1/1652 |
| 2018/0164854 A1* | 6/2018 | Wood | G06F 1/1677 |
| 2018/0284856 A1* | 10/2018 | Shah | G06F 1/206 |

\* cited by examiner

ELECTRONIC DEVICES WITH FLEXIBLE DISPLAYS

This application claims the benefit of provisional patent application No. 62/551,170, filed Aug. 28, 2017, which is hereby incorporated by reference herein in its entirety.

FIELD

This relates generally to electronic devices, and, more particularly, to electronic devices with displays.

BACKGROUND

Electronic devices often include displays for presenting images to a user. Displays are typically formed from rigid planar substrates. Although satisfactory in many situations, rigid displays such as these may be difficult to integrate into certain devices, such as devices with bendable housings.

SUMMARY

An electronic device may have a hinge that allows the device to be flexed about a bend axis. A display may span the bend axis. To facilitate bending about the bend axis without damage when the display is cold, a portion of the display that overlaps the bend axis may be selectively heated.

A temperature sensor in the device may make temperature measurements on the portion of the display overlapping the bend axis. The device may also have user input devices for gathering user input and a motion sensor for determining when the device has been picked up for use.

The portion of the display that overlaps the bend axis may be self-heated by illuminating pixels in the portion of the display that overlap the bend axis or may be heated using a heating element or other heating structure that provides heat to the portion of the display overlapping the bend axis. Heating may be initiated based on user input, temperature information, information from a motion sensor, or other factors.

Control circuitry may engage a latching mechanism that prevents folding of the electronic device and the display when the temperature of the portion of the display that overlaps the bend axis is below a predetermined temperature.

DETAILED DESCRIPTION

Figure 1:
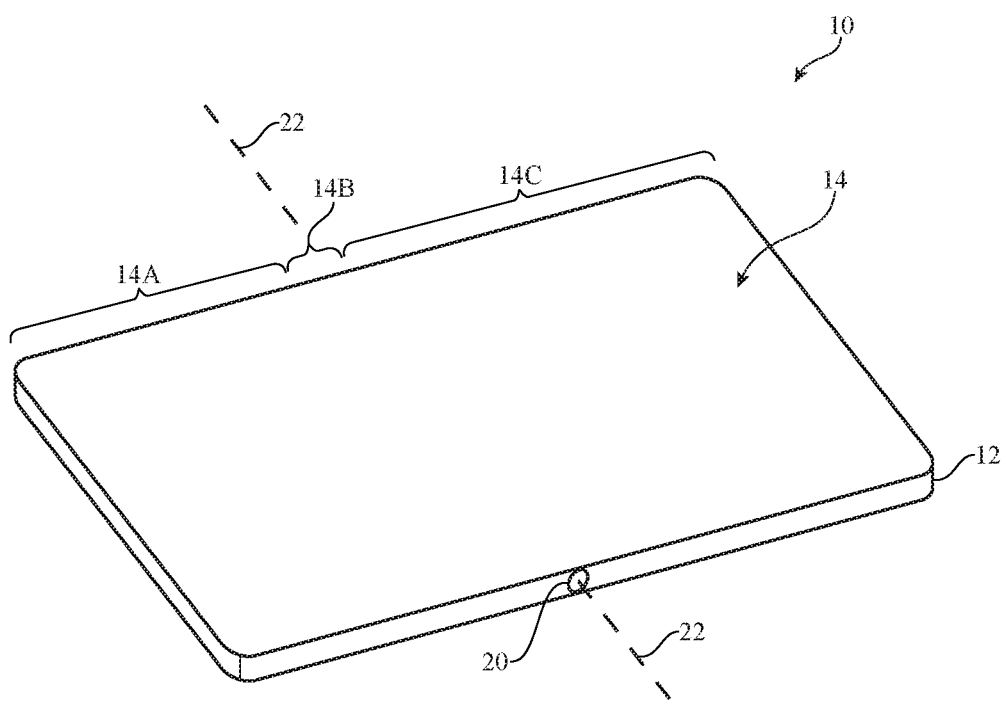
FIG. 1 is a perspective view of an illustrative electronic device having a display in accordance with an embodiment.

An illustrative electronic device of the type that may be provided with a flexible display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a wearable or miniature device of other types, a computer display that does not contain an embedded computer, a computer display that includes an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, watch or other wrist device, or other portable computing device. Other configurations may be used for device 10 if desired. The example of FIG. 1 is merely illustrative.

In the example of FIG. 1, device 10 includes a display such as display 14 mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Housing 12 may have hinge structures such as hinge 20 to allow device 10 to bend about bend axis 22. Housing 12 may have first and second housing portions that rotate with respect to each other as device 10 is bent (folded) about bend axis 22 using hinge 20 or other flexible structures joining the first and second housing portions.

Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures. A touch sensor may be formed using electrodes or other structures on a display layer that contains a pixel array or on a separate touch panel layer that is attached to the pixel array (e.g., using adhesive).

Display 14 may include pixels formed from liquid crystal display (LCD) components, electrophoretic pixels, microelectromechanical (MEMs) shutter pixels, electrowetting pixels, micro-light-emitting diodes (small crystalline semiconductor die), organic light-emitting diodes (e.g., pixels in a thin-film organic light-emitting diode display), or pixels based on other display technologies. Configurations in which display 14 has an array of light-emitting pixels such as an array of organic light-emitting diode pixels may sometimes be described herein as an example.

Display 14 may have a portion that overlaps bend axis 22. To facilitate bending of device 10 about axis 22, all of display 14 may be formed using flexible structures or at least the portion of display 10 that overlaps bend axis 22 may be formed using flexible structures. A display cover layer or other layer may form the outermost surface of the display. Display layers such these (e.g., display cover layers) may be formed from glass, plastic, and/or other transparent display cover layer structures and may be flexible (at least where these layers overlap bend axis 22 of device 10).

As shown in FIG. 1, for example, display 14 may have three portions such as portions 14A, 14B, and 14C. In portions 14A and 14C, display 14 may be flexible or may be rigid (e.g., the pixel array in these areas may be rigid and/or the display cover layer structures in these regions may be rigid). Flexible portion 14B overlaps bend axis 22 and forms a strip that lies between portions 14A and 14C and that extends across the width of the display between opposing edges of the display. To ensure that flexible portion 14B is sufficiently flexible to allow device 10 to bend about axis 22, display layers such as a display cover layer for display 14 may be formed from a thin flexible glass or polymer layer that accommodates bending of display 14 about axis 22 and underlying display layers (e.g., a polymer substrate, metal traces, a polarizer layer, a touch sensor layer, adhesive layers, and other conducting and dielectric layers in an organic light-emitting diode pixel array) may also be formed from flexible materials and structures.

In cold operating environments (e.g., temperatures significantly below room temperature such as temperatures below 10° C., below 0° C., −40° C. to −10° C., or other cold temperatures), materials such as adhesives in flexible portion 14B may become inflexible. To help avoid damage to flexible portion 14B when device 10 is bent open or closed about axis 22, flexible portion 14B may be heated (e.g., while other portions such as portions 14A and 14C of display 14 are not heated or are heated less to conserve energy). Portion 14B may, for example, be heated by using heat spreading structures that help spread heat from integrated circuits and other components in device 10 to portion 14B. With another illustrative arrangement, a heating element under portion 14B may be used to heat portion 14B. Another illustrative arrangement involves self-heating operations. In a self-heating arrangement, pixels in display 14 are illuminated. For example, the light-emitting diodes in at least those pixels in display 14 that are in portion 14B may be turned on to produce light and heat. The heat produced by the illuminated pixels can heat portion 14B (e.g., to room temperature or other suitable temperature that is elevated relative to an initial cold temperature) and help prevent damage to sensitive structures in portion 14B as portion 14B is bent about axis 22.

Figure 2:
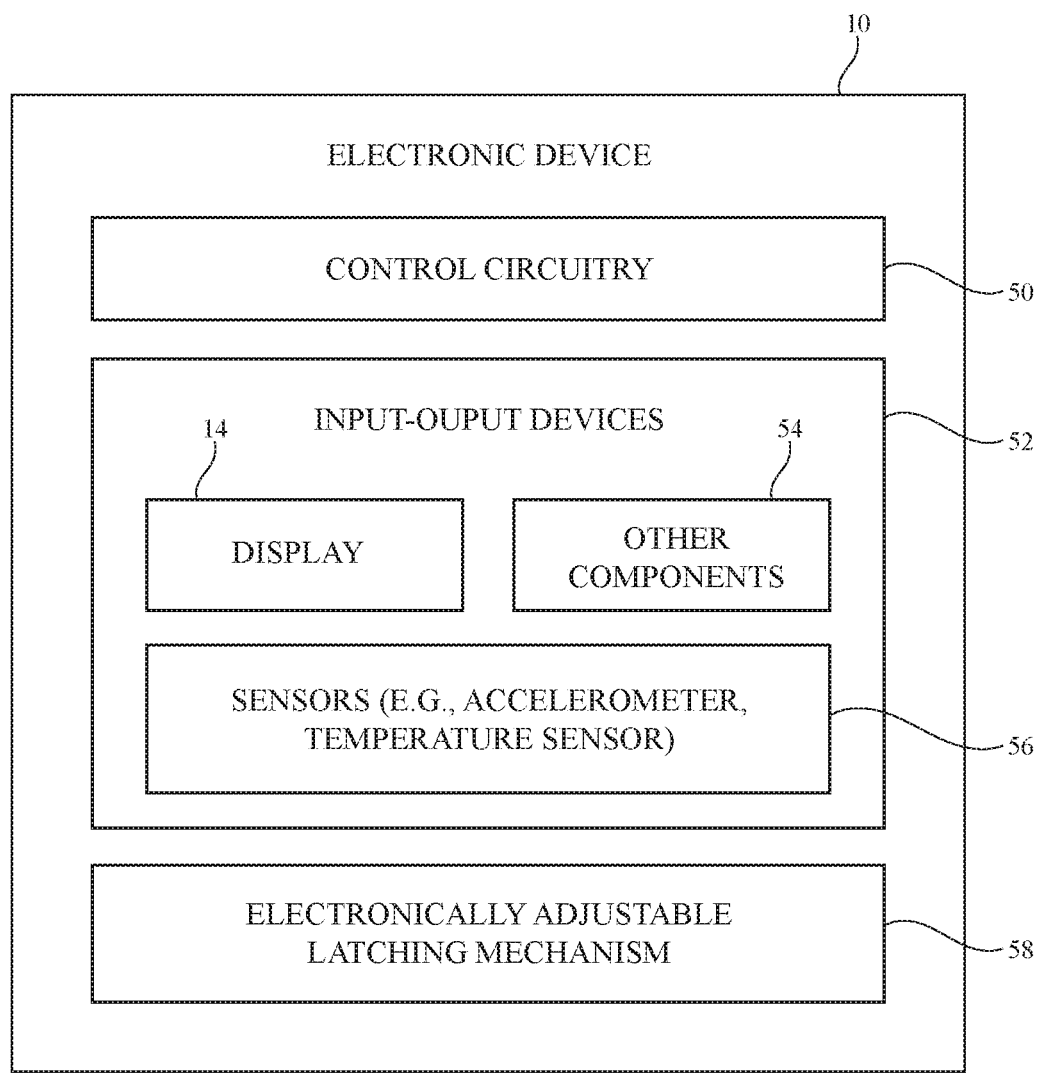
FIG. 2 is a schematic diagram of an illustrative electronic device having a display in accordance with an embodiment.

A schematic diagram of an illustrative electronic device such as device 10 of FIG. 1 is shown in FIG. 2. As shown in FIG. 2, electronic device 10 may have control circuitry 50. Control circuitry 50 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 50 may be used to control the operation of device 10 (e.g., to process sensor signals and other input and to control adjustable components such as a display, a heating element, etc.). The processing circuitry may be based on one or more microprocessors, microcontrollers, digital signal processors, baseband processors, power management units, audio chips, application specific integrated circuits, etc.

Input-output circuitry in device 10 such as input-output devices 52 may be used to allow data to be supplied to device 10 and to allow data to be provided from device 10 to external devices. As shown in FIG. 2, input-output devices 52 may include display 14. Display 14 may be a touch screen that incorporates a two-dimensional touch sensor or may be insensitive to touch. A two-dimensional touch sensor for display 14 may be formed from an array of capacitive touch electrodes touch sensor or other touch sensor components (e.g., force sensors, resistive touch sensors, acoustic touch sensors, optical sensors, etc.).

Input-output devices 52 may include sensors 56. Sensors 56 may include a capacitive proximity sensor, a light-based proximity sensor, a magnetic sensor, a force sensor such as a force sensor that gathers user input, a touch sensor for gathering user touch input, a temperature sensor, a pressure sensor, an ambient light sensor, a microphone or other sound sensor that gathers ambient noise measurements and user input such as voice commands, sensors for gathering data on device position and motion such as inertial measurement units that include accelerometers, compasses, and/or gyroscopes, and/or other sensors.

Input-output devices 52 may also include other components 54 such as buttons, joysticks, scrolling wheels, touch pads, key pads, keyboards, speakers, tone generators, vibrators, cameras, light-emitting diodes and other status indicators, data ports, etc. A user can control the operation of device 10 by supplying user input commands through input-output devices 52 and may receive status information and other output from device 10 using the output resources of input-output devices 52.

Control circuitry 50 may be used to run software on device 10 such as operating system code and applications. During operation of device 10, the software running on control circuitry 50 may display images on display 14 (e.g., video, still images such as text, alphanumeric labels, photographs, icons, other graphics, etc.) using an array of pixels in display 14. In self-heating arrangements, control circuitry 50 can use display 14 to display patterns of light (e.g., images or other patterns of light) that heat portion 14B of display. For example, control circuitry 50 can direct the pixel array in display 14 to illuminate some or all of the pixels in portion 14B so that heat generated by the illuminated pixels will heat portion 14B.

In some configurations for device 10, device 10 may include an electrically adjustable latching mechanism such as latching mechanism 58. Latching mechanism 58 may be engaged when it is cold and portion 14B is therefore sensitive to bending stress (e.g., when adhesive or other materials in portion 14B have become stiff from the cold and susceptible to damage if flexed). By engaging latching mechanism whenever portion 14B is cold to prevent device 10 from being unfolded, undesired damage to portion 14B can be avoided. Latching mechanism 58 may be disengaged when the temperature of portion 14B is sufficiently high to avoid damage during bending.

Figure 3:
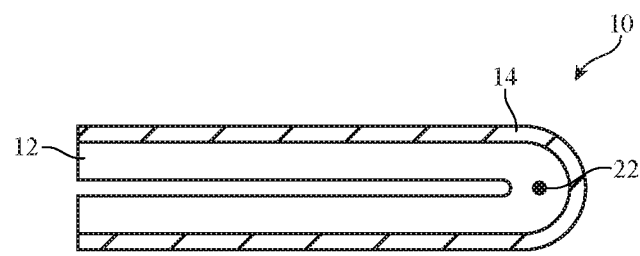
FIGS. 3 and 4 are cross-sectional side views of electronic devices with flexible displays in accordance with an embodiment.
Figure 4:
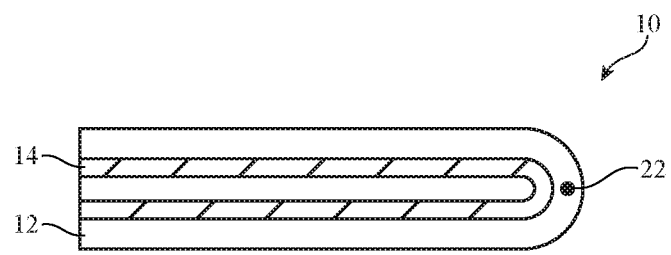

As shown in FIG. 3, device 10 may be folded (bent by 180° or other suitable amount) about bend axis 22 so that display 14 is visible from the outside of device 10 in its folded state. FIG. 4 shows how device 10 may be folded about bend axis 22 so that display 14 is protected within the interior of device 10. Device 10 may have flexible structures (e.g., a hinge) to allow outward bending of the type shown in FIG. 3, to allow inward bending of the type shown in FIG. 4, or to allow bending of both the type shown in FIG. 3 and the type shown in FIG. 4. Configurations in which device 10 is flexed by different amounts (e.g., more than 180° or less than 180°) may also be used.

Figure 5:
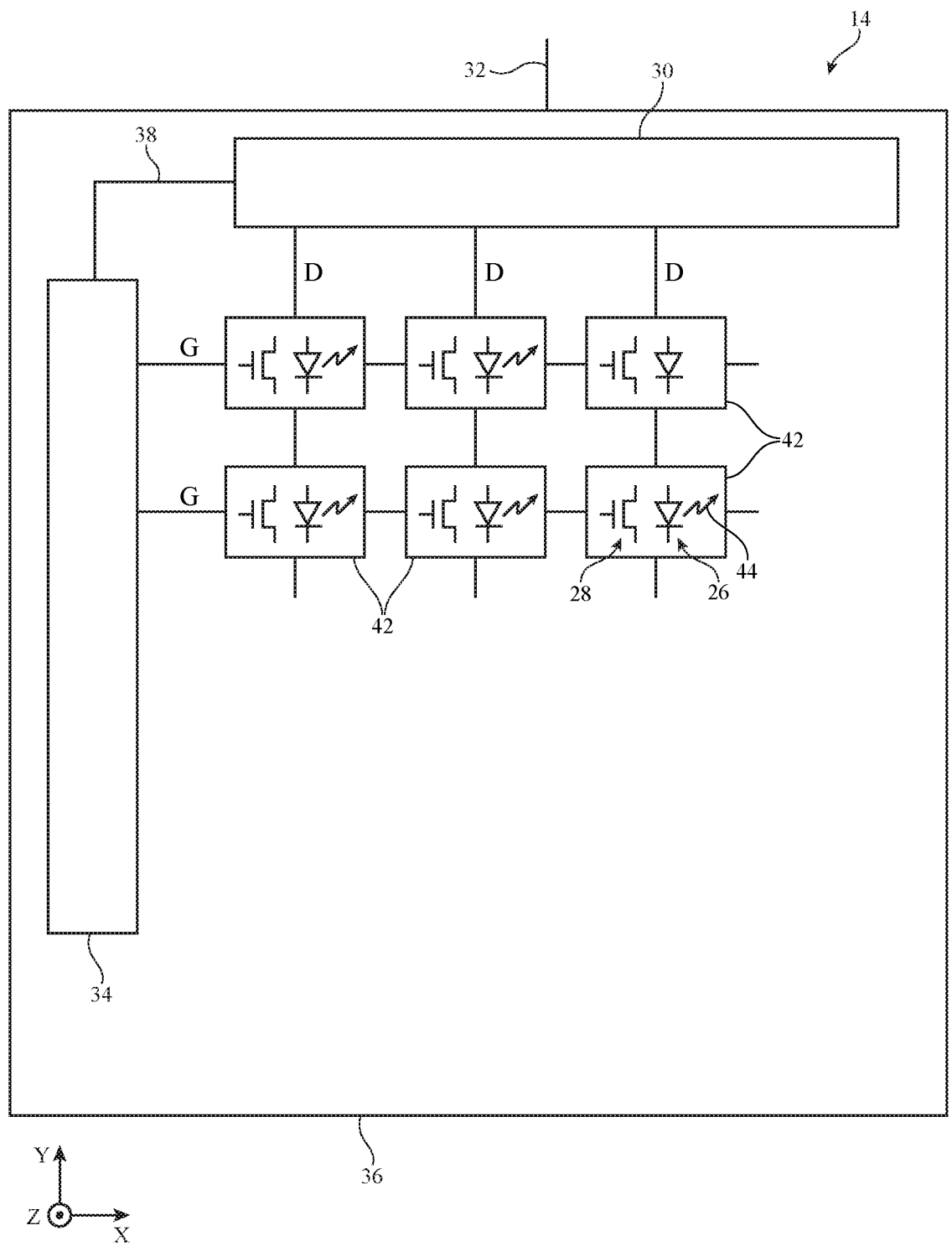
FIG. 5 is a diagram of an illustrative display with an array of light-emitting pixels in accordance with an embodiment.

Display 14 may have a rectangular shape (i.e., display 14 may have a rectangular footprint and a rectangular peripheral edge that runs around the rectangular footprint) or may have other suitable shapes. A top view of circuitry in an illustrative display with a rectangular shape is shown in FIG. 5. As shown in FIG. 5, display 14 may have an array of pixels 42 formed on substrate 36. Substrate 36 may be formed from glass, metal, plastic, ceramic, or other substrate materials. Pixels 42 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 42 in display 14 (e.g., tens or more, hundreds or more, or thousands or more). Each pixel 42 may have a light-emitting diode 26 that emits light 44 under the control of a pixel circuit formed from thin-film transistor circuitry such as thin-film transistors 28 and thin-film capacitors). Thin-film transistors 28 may be polysilicon thin-film transistors, semiconducting-oxide thin-film transistors such as indium gallium zinc oxide transistors, or thin-film transistors formed from other semiconductors. Pixels 42 may contain light-emitting diodes of different colors (e.g., red, green, and blue diodes for red, green, and blue pixels, respectively) to provide display 14 with the ability to display color images.

Display driver circuitry may be used to control the operation of pixels 42. The display driver circuitry may be formed from integrated circuits, thin-film transistor circuits, or other suitable circuitry. Display driver circuitry 30 of FIG. 2 may contain communications circuitry for communicating with system control circuitry such as control circuitry 50 of FIG. 2 over path 32. Path 32 may be formed from traces on a flexible printed circuit or other cable. During operation, the control circuitry (e.g., control circuitry 50 of FIG. 2) may supply circuitry 30 with information on images to be displayed on display 14.

To display the images on pixels 42, display driver circuitry 30 may supply image data to data lines D while issuing clock signals and other control signals to supporting display driver circuitry such as gate driver circuitry 34 over path 38. If desired, circuitry 30 may also supply clock signals and other control signals to gate driver circuitry on an opposing edge of display 14 or may use display driver circuitry with other layouts. The configuration of FIG. 5 is illustrative.

Gate driver circuitry 34 (sometimes referred to as horizontal control line control circuitry) may be implemented as part of an integrated circuit and/or may be implemented using thin-film transistor circuitry. Gate lines G (sometimes referred to as horizontal control lines) in display 14 may carry gate line signals (sometimes referred to as scan line signals, emission enable control signals, etc.) for controlling the pixels of each row. There may be any suitable number of control signals per row of pixels 22 (e.g., one or more, two or more, three or more, four or more, etc.).

Figure 6:
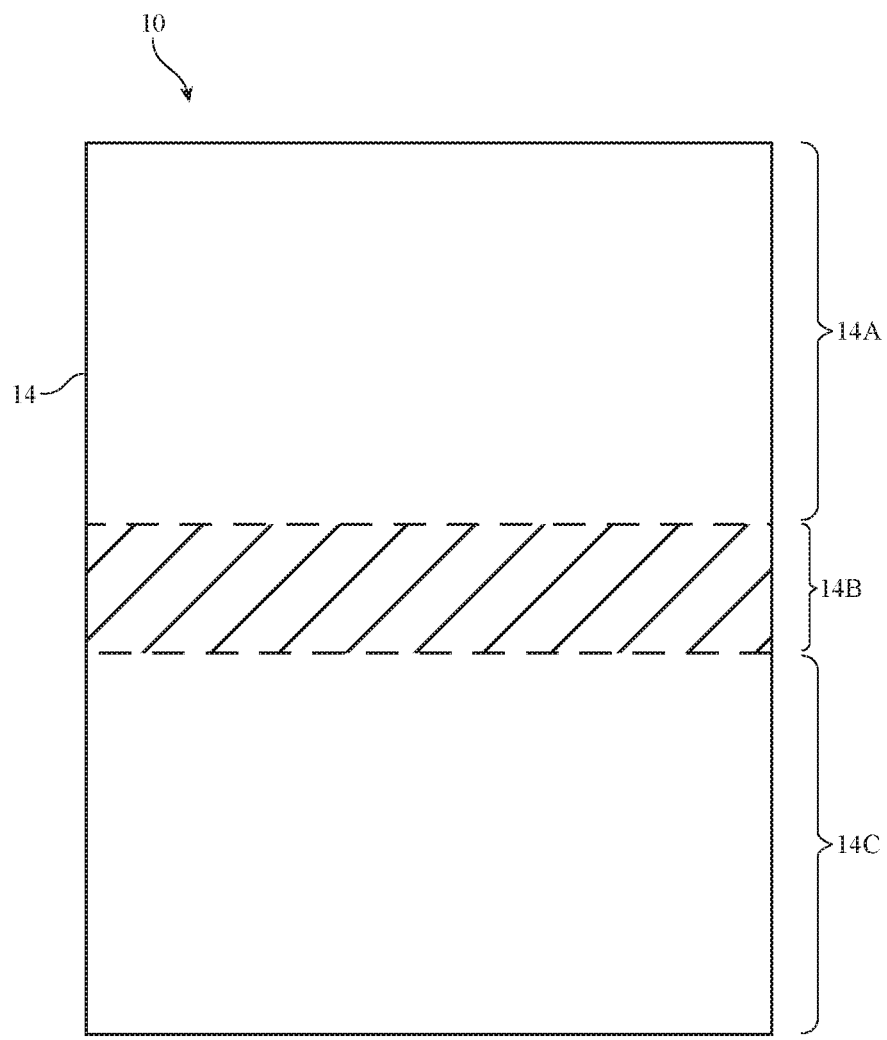
FIG. 6 is a display in which pixels overlapping a bend axis have been illuminate to heat the portion of the display overlapping the bend axis in accordance with an embodiment.

During self-heating operations, some or all of pixels 42 in the pixel array of display 14 are illuminated (fully or partially). Turning pixels 42 on in this way creates a pattern of light on display 14. The pattern of light may include text, icons, a logo or other images, may be a solid or graded block, or may form any other image or abstract pattern (e.g., a solid bright white area, an area of a particular color or pattern of colors, a photograph, etc.). To conserve energy, it may be desirable to only or to primarily illuminate pixels 42 that overlap flexible portion 14B of display 14, as shown in FIG. 6. With this type of arrangement, the pixels in region 14B may be configured to output light 44 at their maximum intensity to speed the self-heating process.

Figure 7:
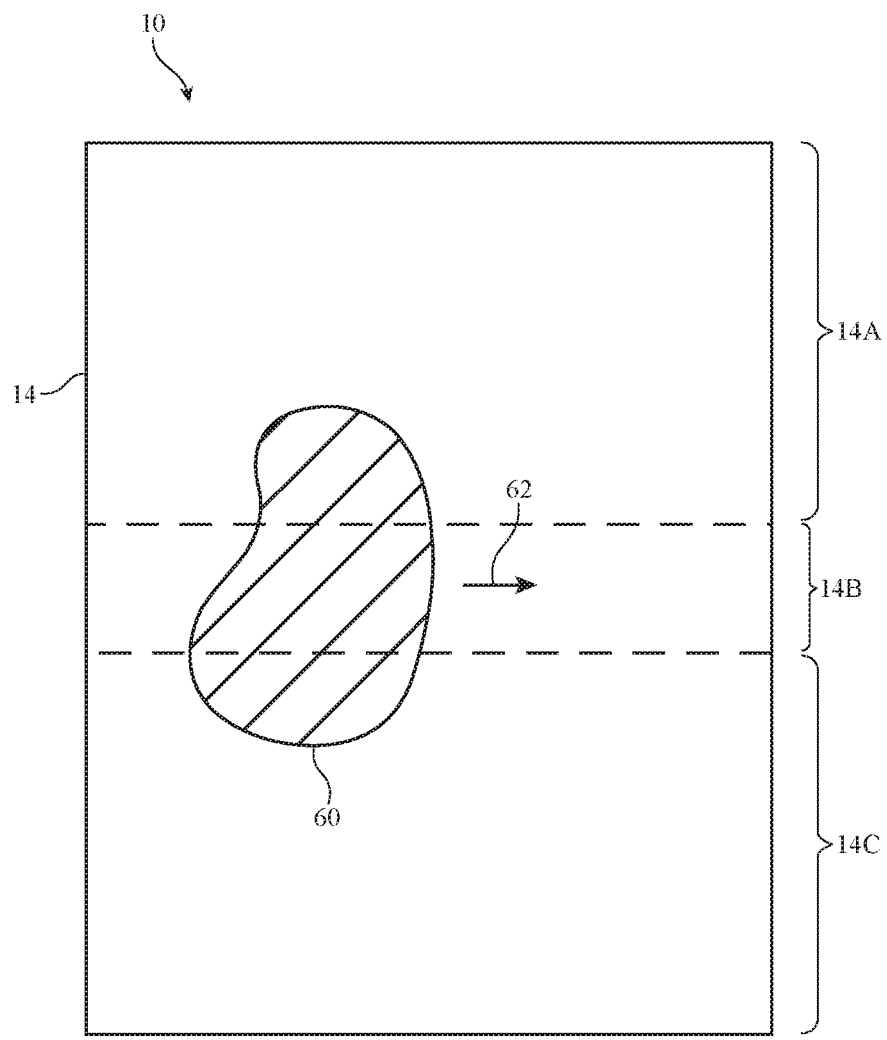
FIG. 7 is display in which a screen saver is being presented to help heat a portion of the display overlapping a bend axis in accordance with an embodiment.

If desired, portion 14B may be heated by illuminating pixels 42 in other patterns. As shown in FIG. 7, for example, a screen saver element such as illuminated item (screen saver) 60 may be presented on display 14. Item 60 may be displayed on any suitable portion of display 14 and may, if desired, be moved over time. To self-heat portion 14B, item 60 passes over portion 14B. Battery power in device 10 may be conserved by enhancing the amount of time that the illuminated pixels of item 60 spend overlapping overlap portion 14B. For example, screen-saver item 60 may be moved along a direction such as direction 62 that overlaps portion 12B, so that the illumined pixels of item 60 help warm portion 12B more than other portions of display 14.

In general, any suitable pattern of pixels 42 may be illuminated on display 14 to heat portion 12B (e.g., all of pixels 42 in display 14 may be turned on, only pixels 42 that overlap region 14B may be turned on, all pixels 42 in portion 14B may be turned on, a moving object(s) may be used to perform self-heating by at least periodically turning on pixels 42 in portion 14B, and/or other pixels 42 may be illuminated to generate heat that heats portion 14B). The examples of FIGS. 6 and 7 are illustrative.

The operations involved in heating portion 14B by illuminating pixels 42 (e.g., self-heating operations) can be performed in response to detection of use of device 10 (e.g., detection of an accelerometer signal that indicates that a user has picked up device 10 and is therefore expected to use device 10, detection of a touch sensor input, button press input, microphone input, force sensor input, or other user input, etc.) and/or in response to detected temperature values below a predetermined threshold level. If desired, portion 14B may also be performed continuously (e.g., whenever the measured temperature drops below a predetermined threshold level).

Figure 8:
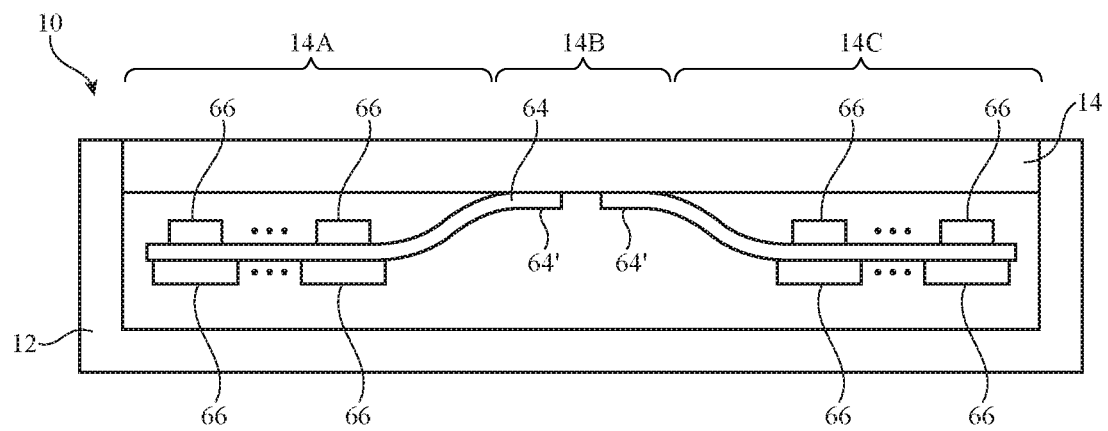
FIG. 8 is a cross-sectional side view of an illustrative electronic device with heat conducting structures configured to heat a bendable portion of a display in accordance with an embodiment.

FIG. 8 shows how device 10 may be provided with heat distribution structures 64 that help spread heat from electrical components 66 (e.g., integrated circuits associated with control circuitry 50, input-output devices 52, and/or other circuitry in device 10) to display portion 14B. Heat distribution structures 64 may be heat spreading layers formed from laminated layers of heat-conducting and strength-enhancing materials (e.g., copper layers and stainless steel layers, respectively) and/or other heat-conducting sheets (e.g., layers of graphite, etc.). Portions 64' of structures 64 may be formed adjacent to portion 14B of display 14, so that portion 14B is warmed when device 10 is powered and electrical components 66 are producing heat.

Figure 9:
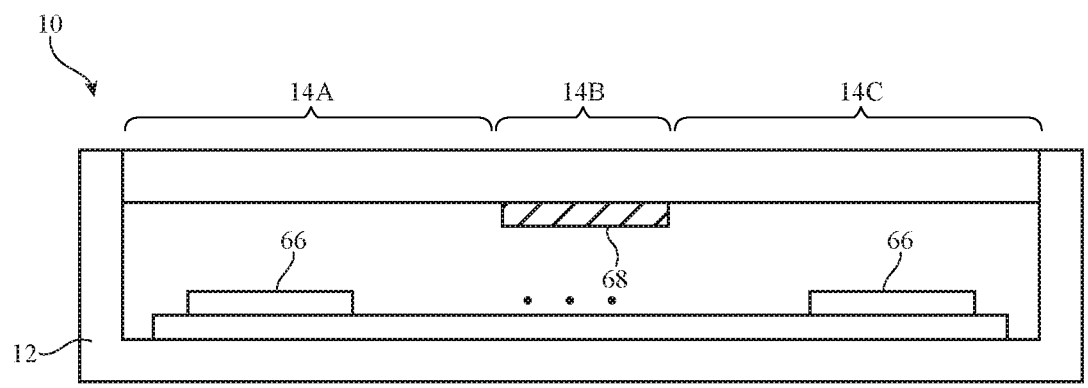
FIG. 9 is a cross-sectional side view of an illustrative electronic device with a heating element to heat a bendable portion of a display in accordance with an embodiment.

Another illustrative configuration for heating portion 14B of display 14 is shown in FIG. 9. As shown in FIG. 9, heating element 68 may be formed selectively under portion 14B (e.g., under portion 14B but not under portions 14A and 14C). Heating element 68 may be formed from an ohmic heater that heats upon application of current, may be formed from a Peltier effect heating element, and/or may be formed from other heating structures. During operation, control circuitry 50 may use heating element 68 to selectively heat portion 14B of display 14.

Figure 10:
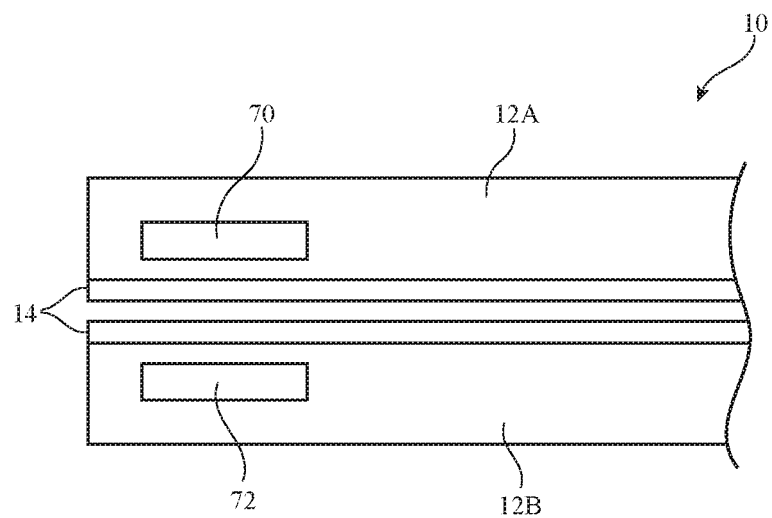
FIG. 10 is a cross-sectional side view of a portion of an electronic device with an electrically adjustable magnetic latching mechanism in accordance with an embodiment.
Figure 11:
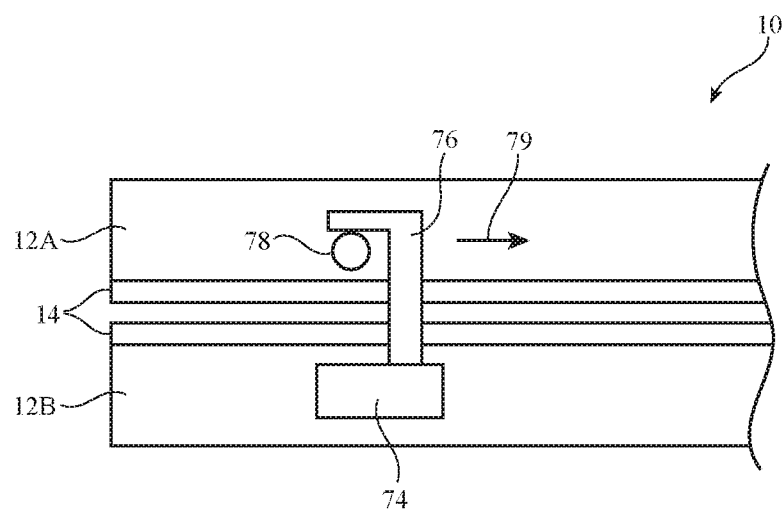
FIG. 11 is a cross-sectional side view of a portion of an electronic device with an illustrative electrically adjustable mechanical latching mechanism in accordance with an embodiment.

FIGS. 10 and 11 show how device 10 may have a latching mechanism that is used to hold housing 12 and device 10 in a closed (folded) configuration when portion 14B of display 14 is cold. In the example of FIG. 10, housing 12 has been bent about bend axis 22, so that end portion (housing structures) 12A and end portion (housing structures) 12B of housing 12 face each other. In this example, display 14 has been folded inwardly. Outwardly folding display arrangements may also be used, if desired.

When housing 12 is folded so that portions 12A and 12B are adjacent to each other, the latching mechanism can be engaged (e.g., to prevent damage to display 14 while portion 14B is cold). When it is desired to release portions 12A and 12B and thereby allow device 10 to be opened for use, the latching mechanism can be disengaged.

The illustrative latching mechanism of FIG. 10 includes first component 70 in device housing portion 12A and second component 72 in device housing portion 12B. Components 70 and 72 may interact magnetically when it is desired to hold device 10 in a folded (closed) state. In one illustrative configuration, both of components 70 and 72 are electromagnets. In another illustrative configuration, component 72 may be an electromagnet and component 70 may be a magnetic structure (e.g., a permanent magnet or a magnetic structure formed from iron, ferrite, or other magnetic material). When control circuitry 50 activates the electromagnet(s), housing portion 12A and housing portion 12B are held together by magnetic attraction and the user of device 10 will be prevented from unfolding device 10. When it is desired to disengage the magnetic latching mechanism of FIG. 10, control circuitry 50 can turn off the control signals (drive current) applied to the electromagnet(s).

The illustrative latching mechanism of FIG. 11 includes electrically controlled actuator 74 and latch member 76 in housing portion 12B and a corresponding latch member such as pin 78 in housing portion 12B. When latch member 76 is placed in the position shown in FIG. 11, latch member 76 will engage pin 78 and thereby hold portions 12A and 12B to each other. When control circuitry 50 uses actuator 74 to move latch member 76 in direction 79, latch member 76 will disengage from pin 78, thereby releasing portions 12A and 12B so that device 10 can be unfolded by moving these portions away from each other.

Figure 12:
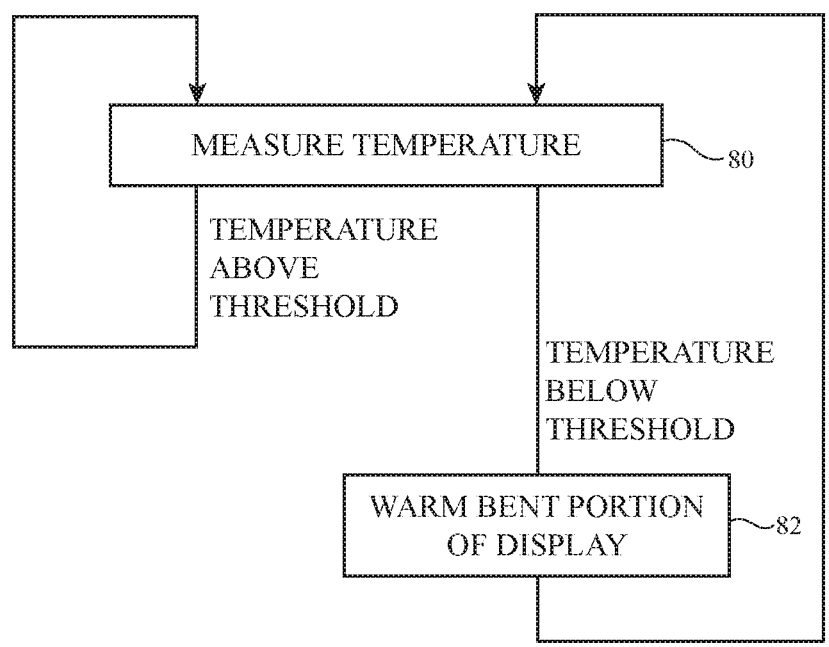
FIG. 12 is a flow chart of illustrative operations involved in maintaining a bendable portion of a display above a predetermined temperature in accordance with an embodiment.

FIG. 12 is a flow chart of illustrative operations involved in maintaining display portion 14B at a temperature that helps prevent damage to display 14 as display 14 is bent about bend axis 22. During the operations of block 80, control circuitry 50 may use a temperature sensor (e.g., a temperature sensor adjacent to portion 14B) to measure the temperature of device 10 (e.g., portion 14B). If the temperature is above a predetermined temperature (e.g., a temperature value serving as a threshold), control circuitry 50 may conclude that portion 14B is sufficiently warm to obviate the need for supplemental heating. Processing may then loop back to block 80 so that additional temperature measurement can be gathered. If the temperature measured during block 80 is below the predetermined temperature, portion 14B of display 14 and/or other portions of display 14 may be heated during the operations of block 82. During block 82, for example, a screen saver element or other pattern of light may be displayed in portion 14B (e.g., pixels 42 may be illuminated in portion 14B) to heat portion 14B, a heating element under portion 14B may be used to heat portion 14B, and/or other heating techniques may be used to heat portion 14B (see, e.g., the heat spreading arrangement of FIG. 8). This process may be continued continuously (e.g., heating or not heating portion 14B as appropriate based on measured temperature) and/or this process may be started and/or halted based on other factors (e.g., whether device 10 is being carried by user, time of day, usage history, etc.).

Figure 13:
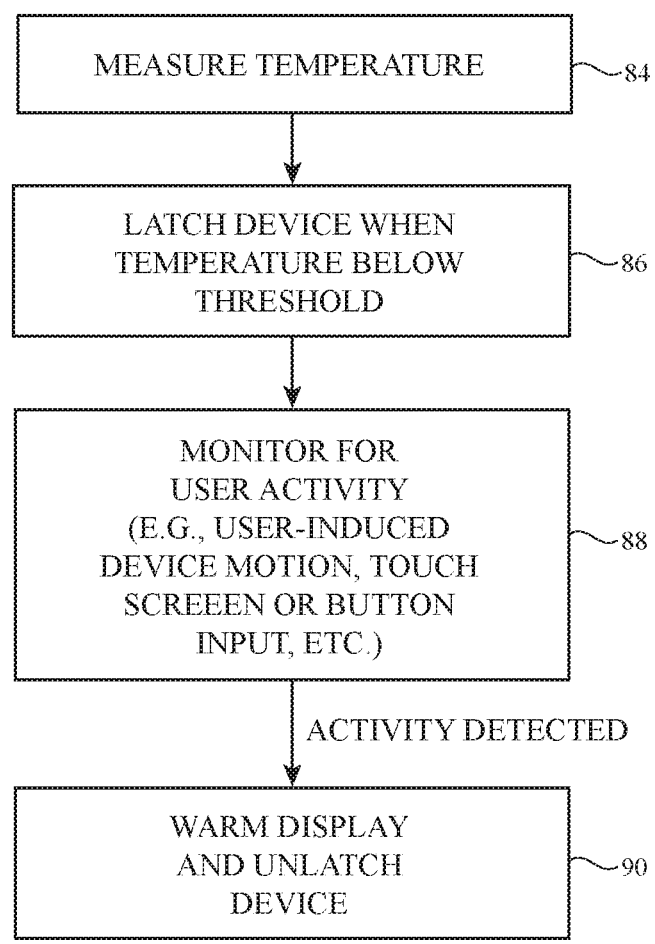
FIG. 13 is a flow chart of illustrative operations involved in heating a bendable portion of a display before the display is bent in accordance with an embodiment.

FIG. 13 is a flow chart of illustrative operations involved in selectively latching and unlatching device 10 and in heating display portion 14B. These operations may be performed in response to user input, temperature measurements, measurements from a motion sensor such as an accelerometer that determines when device 10 has been picked up for use, and/or other factors.

During the operations of block 84, control circuitry 50 may use a temperature sensor in sensors 56 to measure the temperature of portion 14B of display 14 (e.g., by measuring the temperature of device 10, by measuring the temperature of display 14 at portion 14B, etc.).

During the operations of block 86, control circuitry 50 may compare the measured temperature to a predetermined temperature (e.g., a threshold temperature). If the temperature is above the predetermined temperature, portion 14B is not sufficiently cold to warrant heating and is warm enough to allow device 10 to be freely opened and closed. If, however, the temperature is below the predetermined temperature, control circuitry 50 can engage the latching mechanism (e.g., the electromagnetic latching mechanism of FIG. 10, the mechanical latching mechanism of FIG. 11, etc.), thereby preventing device 10, display 14, and housing 12 from being bent.

During the operations of block 88, display 14B may remain unheated (or, if desired, display 14 can be heated using low amounts of self-heating and/or low amounts of heat from heating element 68 or components 66, etc.). Control circuitry 50 can use sensors 56 (e.g., a motion sensor such as an accelerometer, a touch sensor such as a touch screen sensor, etc.) and/or other components (e.g., buttons that receive user input) to monitor for use of device 10. If, for example, device 10 is at rest for a long period of time and is suddenly picked up by a user, control circuitry 50 can detect that device 10 has been picked up and is about to be used by analyzing accelerometer data. As another example, device 10 can detect that a user is entering touch input into display 14, is pressing buttons on device 10, and/or is otherwise supplying user input to device 10.

When user activity is detected (e.g., by detecting that the user has picked up device 10, pressed a button, provided touch screen input, or provided other user input indicative of use of device 10), control circuitry 50 may, during the operations of block 90 direct pixels 42 in portion 14B of display 14 to produce light, thereby heating portion 14B to a safe temperature. When the safe temperature (e.g., a temperature above the predetermined temperature) is reached, control circuitry 50 can disengage the latching mechanism so that the user may open device 10 and use display 14. If desired, control circuitry 50 may display a warning message on display 14 (e.g., "please wait, display is heating") in addition to or instead of latching display 14 with the latching mechanism. Heating may be performed by illuminating pixels 42 in portion 14B and/or using supplemental heating components (e.g., heater 68 of FIG. 9, etc.).

The foregoing is merely illustrative and various modifications can be made to the described embodiments. The foregoing embodiments may be implemented individually or in any combination.

What is claimed is:

1. An electronic device, comprising:
    a housing that bends about a bend axis, wherein the housing has a first housing portion and a second housing portion and wherein the first and second housing portions rotate with respect to each other about the bend axis;
    a display in the housing;
    a temperature sensor;
    control circuitry configured to heat a portion of the display that overlaps the bend axis by illuminating pixels in the portion of the display in response to temperature information from the temperature sensor; and
    a latch that is controlled by the control circuitry to hold the first housing portion to the second housing portion when the temperature information indicates that a temperature of the portion of the display is below a predetermined threshold temperature.

2. The electronic device defined in claim 1 wherein the latch is a magnetic latch having an electromagnet that is controlled by the control circuitry.

3. The electronic device defined in claim 1 wherein the latch is a mechanical latch having an actuator that is controlled by the control circuitry.

4. The electronic device defined in claim 1 wherein the display is an organic light-emitting diode display having a flexible display portion that overlaps the bend axis.

5. The electronic device defined in claim 1 further comprising an accelerometer, wherein the control circuitry is configured to heat the portion of the display based on information from the accelerometer.

6. The electronic device defined in claim 1 wherein the display has first and second display portions adjacent to the portion of the display that overlaps the bend axis and wherein the control circuitry is configured to heat the portion of the display that overlaps the bend axis by illuminating the pixels in the portion of the display that overlaps the bend axis without illuminating pixels in the first and second display portions.

7. The electronic device defined in claim 1 further comprising a heat spreader layer having portions adjacent to the portion of the display that overlaps the bend axis.

8. The electronic device defined in claim 1 further comprising an ohmic heating element that overlaps the bend axis and that extends across the housing parallel to the bend axis.

9. The electronic device defined in claim 1 wherein the portion of the display overlapping the bend axis has an elongated strip shape and extends between opposing edges of the display.

10. An electronic device, comprising:
    first and second housing structures coupled by a flexible structure that lies along a bend axis;
    a display having first, second, and third portions, wherein the first and third portions are coupled respectively to the first and second housing structures and do not overlap the bend axis and wherein the second portion lies between the first and third portions and has a strip shape extending along the bend axis between opposing edges of the display;
    a temperature sensor that generates temperature information;
    control circuitry configured to heat the second portion more than the first and third portions by selectively illuminating pixels in the second portion in response to the temperature information; and
    a latching mechanism, wherein the control circuitry is configured to:
        engage the latching mechanism to hold the first and second housing structures to each other in response to measuring a temperature with the temperature sensor that is below a predetermined temperature; and
        disengage the latching mechanism to release the first and second housing portions from each other in response to measuring a temperature with the temperature sensor that is above the predetermined temperature.

11. The electronic device defined in claim 10 wherein the control circuitry is configured to heat the second portion by displaying a screen saver in the second portion in response to the temperature information.

12. The electronic device defined in claim 10 wherein the latching mechanism comprises an electromagnet coupled to the first housing structure.

13. The electronic device defined in claim 10 wherein the latching mechanism includes an actuator controlled by the control circuitry.

14. The electronic device defined in claim 10 further comprising a motion sensor, wherein the control circuitry is configured to heat the second portion more than the first and third portions by selectively illuminating the pixels in the second portion in response to information from the motion sensor.

15. The electronic device defined in claim 10 further comprising a sensor configured to gather user input, wherein the control circuitry is configured to heat the second portion more than the first and third portions by selectively illuminating the pixels in the second portion in response to the user input.

16. An electronic device, comprising:
    a housing having first and second housing structures that rotate with respect to each other about a bend axis;
    a display in the housing;
    a temperature sensor that is configured to determine a temperature of the display;
    a latch mechanism; and
    control circuitry that is configured to use the latch mechanism to hold the first housing portion to the second housing portion when the temperature of the display is below a predetermined threshold and to release the first and second housing portions from each other when the temperature of the display is above the predetermined temperature.

17. The electronic device defined in claim 16 wherein the latch mechanism is a magnetic latch having an electromagnet that is controlled by the control circuitry.

18. The electronic device defined in claim 16 wherein the latch mechanism is a mechanical latch having an actuator that is controlled by the control circuitry.

* * * * *